United States Patent [19]

Harra et al.

[11] 4,416,759
[45] Nov. 22, 1983

[54] SPUTTER SYSTEM INCORPORATING AN IMPROVED BLOCKING SHIELD FOR CONTOURING THE THICKNESS OF SPUTTER COATED LAYERS

[75] Inventors: David J. Harra, Santa Cruz; Frederick T. Turner, Sunnyvale; Martin A. Hutchinson, Santa Clara, all of Calif.

[73] Assignee: Varian Associates, Inc., Palo Alto, Calif.

[21] Appl. No.: 325,588

[22] Filed: Nov. 27, 1981

[51] Int. Cl.$^3$ .............................................. C23C 15/00
[52] U.S. Cl. .............................. 204/298; 204/192 R; 118/720; 118/721; 118/504; 118/505
[58] Field of Search ............... 204/192 R, 192 C, 298; 118/720, 721, 504, 505

[56] References Cited

U.S. PATENT DOCUMENTS 3,544,790 12/1970 Brown ................................. 250/49.5
3,897,324 7/1975 Del Monte et al. ................. 204/298

FOREIGN PATENT DOCUMENTS 738393 7/1966 Canada ................................. 204/298
486497 1/1976 U.S.S.R. ............................... 118/504

*Primary Examiner*—Aaron Weisstuch
*Attorney, Agent, or Firm*—Stanley Z. Cole; Leon F. Herbert

[57] ABSTRACT

The arbitrary contouring of thickness of a sputter-deposited film is made possible by a blocking means having a primary blocking shield and an ancillary blocking shield. The primary blocking shield intercepts atoms sputtered directly from the cathode target by line-of-sight transport. The ancillary blocking shield extends downwardly from the side of the primary blocking shield which is placed closest to the substrate. The ancillary blocking shield intercepts atoms sputtered from the cathode which by intervening gas collisions have been redirected to travel underneath the primary blocking shield. Precise tailoring of the thickness profile of the coating on the substrate is thereby provided and the quality of the composite film is maintained. The method for contouring the thickness of sputter coated layers comprises sputter coating portions of the film at successive stations. By employing the improved blocking shield at selected stations, the film in the aggregate may have the desired thickness contour.

6 Claims, 4 Drawing Figures

SPUTTER SYSTEM INCORPORATING AN IMPROVED BLOCKING SHIELD FOR CONTOURING THE THICKNESS OF SPUTTER COATED LAYERS

DESCRIPTION

This invention relates to an apparatus for contouring the thickness of sputter-deposited layers and, more particularly, relates to an improved blocking shield for arbitrarily contouring the thickness of a sputter-deposited layer.

In the fabrication of semiconductor devices, it is increasingly important to precisely control the uniformity of thickness of coated layers. Uniformity in the thickness of coated layers can increase yield, improve the performance of individual semiconductor devices and may allow the devices across the wafer to more consistently meet a particular specification. When semiconductor wafers are coated by sputter coating, a material is sputtered off of a target cathode in such a manner that it deposits on the surface to be coated. See generally, R. W. Berry, et al., *Thin Film Technology*, (1968) and L. J. Maissel, et al., *Handbook of Thin Film Technology*, (1970). Such sputter coated films, for example, of aluminum, are employed for the metallization of integrated circuits. Heretofore, uneven films have either been tolerated or attempts have been made to shape the sputtering cathode or to arrange the geometry of the system in order to deposit as uniform a film as possible.

One technique that has been utilized to enhance the uniformity of sputtered films is the placement of blocking shields between the target cathode and the substrate for at least a portion of the sputtering cycle in order to intercept sputtered atoms which would otherwise be applied to the substrate in areas of the film which form thicker than other areas. In U.S. Pat. No. 3,856,654, of C. H. George, "Apparatus for Feeding and Coating Masses of Workpieces in a Controlled Atmosphere," a system is disclosed in which substrates move on a circular track around a central cylindrical cathode. Each substrate is exposed in succession to a particular segment of the cathode. At most stations, the substrate is exposed to the cathode without interference. However, at selected stations a fixed blocking shield is used to shadow a portion of the substrate so that sputtered atoms are only received by the unshadowed portions of the substrate. By selecting the number of stations which have blocking shields and by selecting the size and shape of the blocking shields, the effect of non-uniformities which are introduced by the system may be substantially reduced. More uniform sputtered films may thereby be produced. In U.S. Pat. No. 3,904,503, A. M. Hanfmann, "Depositing Material on a Substrate Using a Shield," a system is disclosed whereby planar shields of various shapes and sizes are introduced between a cathode target and a substrate. The inherent deposition characteristics of the system are first observed, non-uniformities are noted and then the shape, size and placement of the shield is determined. Shields of variable shapes are also disclosed. The apparatus disclosed in these two patents permits first order uniformity corrections to be obtained. However, it has been found that since gas scattering is also a transport mechanism that blockage of line-of-sight transport does not provide complete shadowing and that the most optimum uniformity is not necessarily obtained. Sputtered atoms which are gas scattered will move underneath the shield and either add to the film under the shield or deposit loosely on top of the film deposited under the shield.

It is therefore an object of the present invention to provide ancillary blockage to the sputtered atoms for enhancing the uniformity correction obtained by the use of the primary blocking shield placed inbetween a sputtering source and a substrate.

It is an additional object of the present invention to provide an apparatus which prevents the transport of sputtered atoms by the sputtering mechanism of gas collision onto portions of the substrate shielded from line-of-sight deposition.

It is a still further object of the present invention to permit the more precise contouring of thickness of a sputtered film by means of an ancillary blocking shield used in conjunction with a primary blocking shield.

BRIEF DESCRIPTION OF THE DRAWINGS

For a more complete understanding of the present invention, reference may be had to the accompanying drawings which are incorporated herein by reference and in which.

SUMMARY OF THE INVENTION

The arbitrary contouring of thickness of a sputter-deposited film is made possible by an ancillary blocking shield which is provided for use in conjunction with a primary blocking shield. The ancillary blocking shield extends downwardly from the side of the primary blocking shield which is placed closest to the substrate. The blocking shield intercepts atoms sputtered directly from the cathode target generally by line-of-sight transport. The ancillary blocking shield intercepts atoms sputtered from the cathode which by intervening gas collisions have been directed underneath the primary blocking shield. Precise tailoring of the thickness profile of the coating on the substrate is thereby provided and the quality of the composite film is maintained.

DESCRIPTION OF THE PREFERRED EMBODIMENTS

Figure 3:
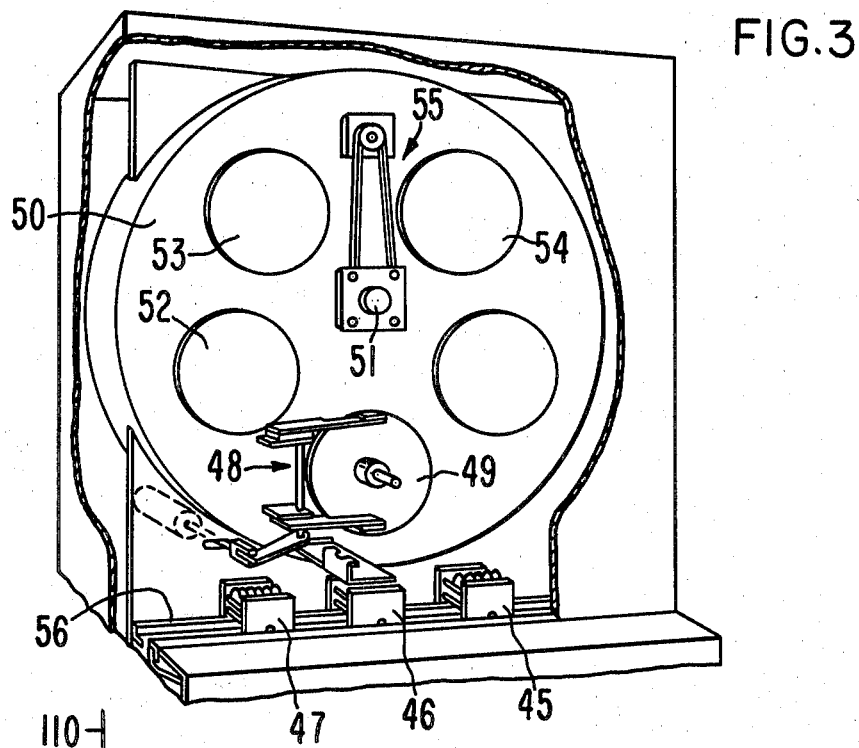
FIG. 3 is a perspective view of a multiple station cassette-to-cassette coater for practicing the method and incorporating the apparatus of the present invention.

Sputter coating, particularly of metals, is an established process in the semiconductor industry. Sputtering cathodes serve as targets for receiving energetic gas ions and are composed of the material to be deposited on the semiconductor wafer, e.g., aluminum, aluminum-copper silicon, refractory metals and silicides or the like. In order to obtain uniform coating on a substrate, the targets may be shaped as disclosed for example in R. M. Rainey, U.S. Pat. No. 4,100,055, "Target Profile for Sputtering Apparatus." As seen in FIG. 3 of this patent, various profiles may be selected for the target so that the distribution of the atoms sputtered from the target over its life will prove to be as uniform as possible. Notwithstanding the proper selection of a target profile, the configuration of a given sputtering station, or the shape of a substrate may introduce non-uniformities to the coating. For certain applications, even if a uniform metal film can be deposited it may be desirable or necessary to deliberately introduce a non-uniformity so as to match, inversely, the non-uniformity of a subsequent metal etching process step. Thus, it has been found desirable to use shields which are positioned inbetween the target cathode and the substrate. Such shields are generally shown, for example, in U.S. Pat. Nos. 3,856,654 and 3,904,503, discussed previously. These shields are typically planar structures which are interposed between the target cathode and the substrate. Thus, atoms sputtered from the cathode will not reach those areas of the substrate which are normally coated more thickly than desired. Generally, the shields intercept those atoms which would travel from a point on the target by line-of-sight transport to these certain areas on the substrate. Incidentally, they intercept a portion of these atoms which experience a gas scattering collision on their way to the substrate. In a sputtering chamber, gas scattering collisions occur because a sputtering atmosphere on the order of about $1 \times 10^{-3}$ torr to about $5 \times 10^{-2}$ torr is maintained, as shown schematically by gas cloud 20 in FIG. 1. There is thus a finite probability that a sputtered atom will collide with an atom or molecule of the sputtering gas, e.g., argon, during its travel to the substrate. However, not all of these sputtered atoms that have been gas scattered are intercepted by the prior art primary blocking shield.

Figure 1:
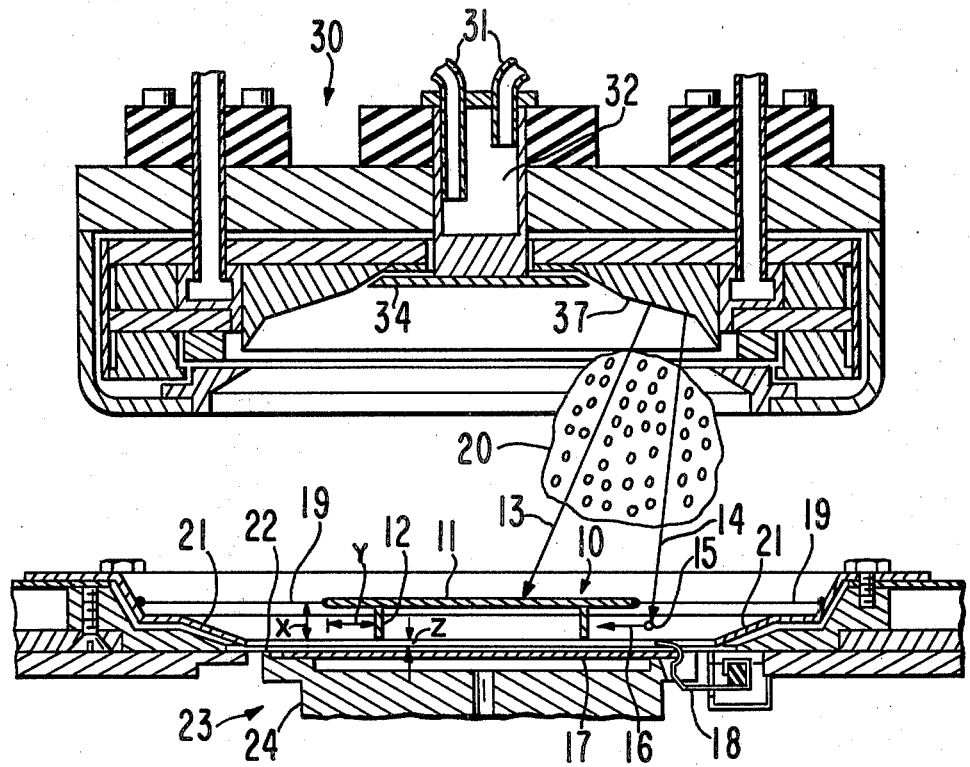
FIG. 1 is a cross-sectional view of a sputtering station including a magnetron source, primary blocking shield, substrate to be coated and the ancillary blocking shield of the present invention.

It has been found that some of the sputtered atoms experience scattering collisions with the sputtering gas adjacent the edge of the blocking plate and develop a component to their direction of travel which is parallel to the surface of the substrate. This is illustrated in FIG. 1 by the sputtered atom having trajectory 14 which experiences a gas scattering collision at point 15. As a result of this collision the sputtered atom is redirected to travel along new trajectory 16 underneath the blocking shield and would be deposited on the supposedly shaded portion of the semiconductor wafer. These spurious deposits are found to integrate into the film as it forms and thereby degrade the quality of the film or are found to not adhere at all and must be cleaned from the surface of the film. Such spurious gas scattered deposits may produce films whose microscopic structure has properties such as grain size and reflectivity which may be markedly different from the properties desired. As seen in FIG. 1, the sputtered atom with trajectory 13 has travelled from sputter cathode 37 to the center of the primary blocking shield 11, whereas the sputtered atom with trajectories 14, 16 has travelled to the center of the substrate, the very place desired to be shaded by primary blocking shield 11. This detracts from the ability to arbitrarily contour the thickness of the sputtered layer, permits the spurious deposits to form in the regions which should otherwise be blocked and may degrade the quality of the sputtered layer.

In theory, the blocking means 10 could be placed immediately adjacent but displaced from wafer slightly so as to maintain a noncontact condition, and the edge effect and gas scattering mechanism would not be especially troublesome. However, it is necessary to position the blocking means 10 sufficiently above the substrate 17 so that primary blocking shield 11 is displaced a distance x above the surface of substrate 17 in order to avoid a step function discontinuity in the sputtered film, i.e., in order to gradually blend the edge of the layer deposited on the unblocked portion with the edge of the layer deposited on the blocked portion. The distance x is great enough so there is no contact with the wafer, but not so great that the shield now becomes an obstruction and intercepts material excessively or so that gas scattered deposits may penetrate to the center of the wafer.

The present invention involves the addition of an ancillary blocking shield 12 to primary blocking shield 11 to intercept the spurious gas scattered atoms described above. Thus, the sputtered atom with trajectory 16 will now be intercepted.

The ancillary blocking shield 12 of the present invention permits the blocking shield 11 to be positioned an appropriate distance x above semiconductor wafer 17 and yet prevents sputtered atoms from travelling by gas scattering in a horizontal direction underneath the primary blocking shield.

When the sputtering system is set up to coat a semiconductor wafer, then blocking shield 11 will be circular and the ancillary blocking shield comprises a ring 12 which extends downwardly from primary blocking shield 11. Ring 12 may be attached to shield 11 or may be formed integrally therewith. Ring 12 may be orthogonal to shield 11 or may be shaped as desired. Ring 12 is displaced a distance y inwardly from the periphery of primary blocking shield 11. In a sputtering system for coating semiconductors, ring 12 is typically placed on primary blocking shield 11 in concentric fashion. Values for these variable distances are chosen in order to tailor the profile of the thickness of the sputtered coating as shown in FIG. 2.

A typical system for utilizing the improved blocking shield is shown in FIG. 1. A cathode having circular symmetry such as conical magnetron source 30 is placed in opposition to a semiconductor wafer holding apparatus 23. The operation of such a conical magnetron source is described in L. T. Lamont, Jr., "A Magnetically Enhanced Sputter Source for Semiconductor Metallizations," *Proceedings, 8th Intl. Vacuum Congress,* France (1980). Briefly, a glow discharge plasma is generated above cathode 37 by maintaining a significant potential difference between anode 34 and cathode 37 in the presence of a sputtering atmosphere. The cathode is actively cooled by introducing a coolant via conduits 31 to cavity 32. Wafer holding apparatus 23 is of the type used in coating stations in the multiple station coater of FIG. 3. Spring clips 18 hold semiconductor wafer 17 on a recessed lip defined by peripheral ledge 22 in base 24. Base 24 sits within an opening defined by plate 21. In the embodiment of FIG. 1, wires 19, attached to plate 21, hold blocking shield 11 of blocking means 10 over semiconductor wafer 17.

Figure 2:
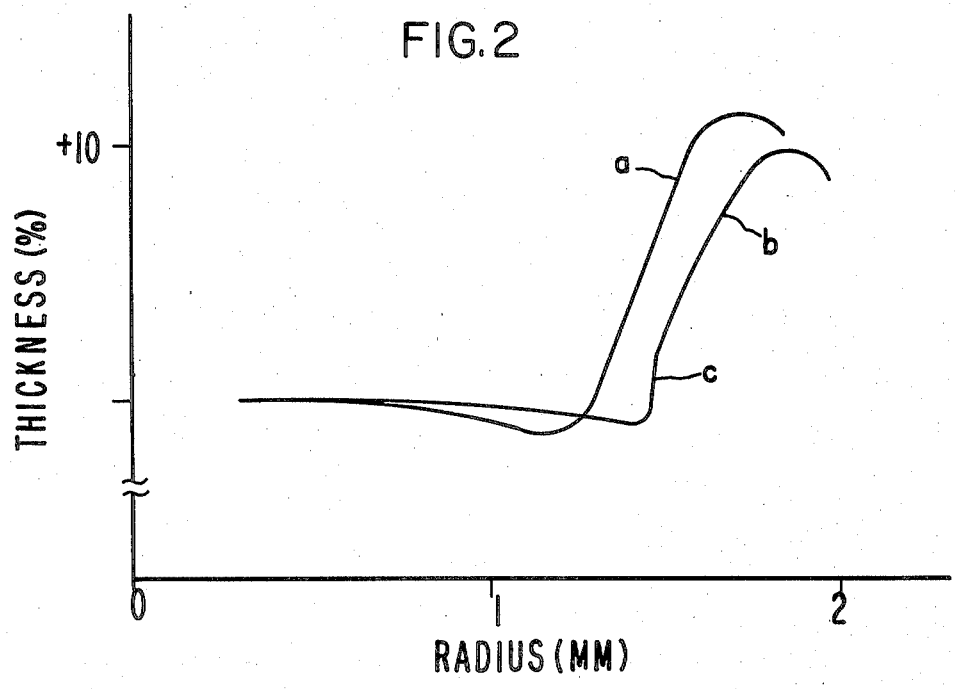
FIG. 2 is a graph showing the contours of film thickness across the wafer for layers formed in accordance with the method of the present invention.

In FIG. 2 curve a shows the contour of film thickness when a centrally disposed primary blocking shield has been used to form a final portion of the film. In this case, the shape of the shield and the deposition time have been selected to fill in a shallow coating around the circumference and to build up the circumferential layer above the rest of the wafer. The buildup is about 10% of the total film thickness over the center. It can be seen that the thickness is greatest around the circumference and drops off gradually as the unblocked and blocked portions blend together. Although the curves do not show it since no ancillary blocking shield was used, there is a likelihood that the film quality has degraded due to the presence of spurious gas scattered atoms. Curve b shows sputtering with the ancillary blocking shield used along with the primary blocking shield. Portions of the curve b are similarly shaped to curve a but displaced due to a slightly larger diameter for the primary blocking shield for curve b. The cutoff of the lower portion of curve b at c represents a shadowing of the substrate by the ancillary blocking shield. Here, although the curves do not show it, a high quality is maintained for the sputtered film since the spurious contributions of gas scattered atoms are curtailed. It has been found that the distance y that the ancillary blocking shield is displaced from the edge of the primary blocking shield, as shown in FIG. 1, will determine this cutoff point. The height x of the primary blocking shield above the substrate 17 will determine the proper amount of gas scattered material for the blend. The height z of the bottom of ancillary blocking shield 12 above the surface will determine the safety factor for non-contact with the wafer.

A novel sputtering sequence has been adopted for utilizing the improved blocking shield of the present invention. This sequence is premised upon having a positive-hold in-line sputter deposition system such as the 3180 Cassette Coating System available from Varian Associates, inc., Palo Alto, Calif. Prior art sputter deposition systems typically involve batch loading and batch coating of semiconductor wafers. Alternately, they used a continuous feed mechanism as exemplified by the Triad System of MRC Corporation, Orangeburg, N.Y. In a positive-hold in-line system, each wafer is presented to a specific work station and held there for a finite period until a specific function is performed. As shown in FIG. 3 and as illustrated in the product brochures entitled "3180 Cassette Coating System-the Cassette-to-Cassette Coater," available from the Palo Alto Vacuum Division of Varian Associates, Inc., 611 Hansen Way, Palo Alto, Calif. 94303, semiconductor wafers are carried in cassettes 45, 46, 47 along track 56. For processing, a semiconductor wafer is loaded from a cassette 46 by an automatic wafer loading mechanism 48 through a vacuum load lock onto one of a plurality of positive-hold stations on revolving plate 50. The semiconductor wafer undergoes processing at each successive position as plate 50 is rotated about its central axis 51 by belt drive 55. Preheating, deposition, sputter etching, cooling or other similar steps, may be accomplished at the successive stations. With such an in-line system having discrete stations, it is possible to carry out sputter coating in successive steps.

Figure 4:
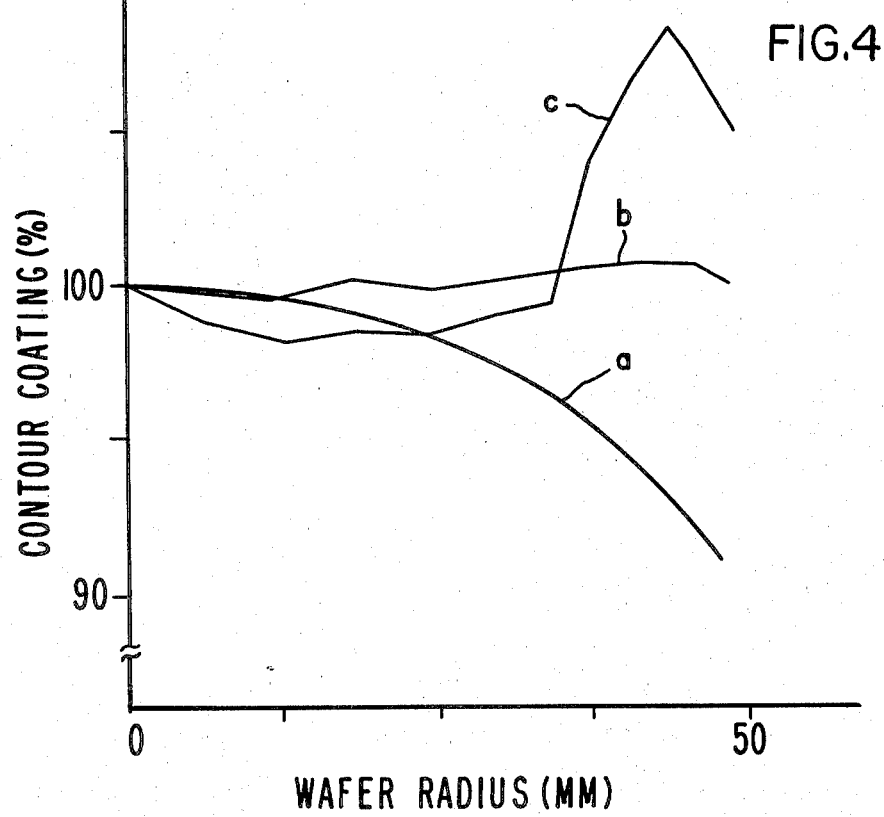
FIG. 4 is a graph showing the contours of film thickness in accordance with the prior art (curve a) and with the present invention (curves b and c).

The method of the present invention comprises combining in succession at least two sputter deposition steps. At least one of the steps is carried out in a sputter deposition station which utilizes a blocking shield such as the improved blocking shield of the present invention. The contours of film thickness of coatings may be tailored by combining the individual profiles of each successive step, e.g., the thickness profile of an unblocked sputter source and the thickness profile of a shielded source. Alternately, shields of strikingly different shapes with different thickness profiles may be used in succession. By varying the residence time at each station, great flexibility is obtained in tailoring the cumulative thickness profiles. For example, station 52 could serve to preheat the wafer. Then, after the wafer is indexed to station 53, a standard sputtering operation could be carried out to apply a metal layer having a thickness profile characteristic of the system, e.g., the profile of curve a in FIG. 4. Finally, after indexing to station 54 a further layer of metal is applied by a sputtering system in which a blocking shield is employed. The shape of the shield is selected to compensate for the nonuniformity introduced at station 53. Since semiconductor wafers are round, a circular shield of the type shown in FIG. 1 may be employed. The diameter of the shield and the height above the wafer are chosen so that the additive annular metal layer has a shape akin to that of curve c of FIG. 4 and so that the cumulative metal layer has a thickness profile which is nearly a straight line, i.e., the thickness of the film is highly uniform, as shown in curve b of FIG. 4. It should be appreciated that there are several variations of the method of operation. These include:

(1) unshielded deposition followed by a shielded deposition with time proportions such that a uniform film is produced.

(2) unshielded deposition followed by a shielded deposition with time proportions such that a deliberately non-uniform film is produced, e.g., a film is produced which is thicker around an annular ring at the periphery of the wafer.

(3) Shielded deposition at a first station followed by a shielded deposition at a second station with the two shields and the time proportions being selected to produce an arbitrary contour required for a particular application.

In all of these method sequences, the improved blocking shield of the present invention or a generalized blocking shield may be used. The order in which the steps are to be performed is not critical; however, for best results, it is preferable to deposit most of the metal first without a blocking shield and then to tailor the cumulative contour by depositing metal using a blocking shield.

What is claimed is:

1. A sputter system comprising an improved blocking shield for contouring the thickness of a sputter-deposited layer, said sputter system including a target cathode, a substrate mounting means and a means for producing a plasma in said system, said improved blocking shield comprising:

a primary blocking shield structure positioned in said sputter system in between said target cathode and said substrate mounting means, said primary blocking shield being positioned in spaced adjacency to said substrate mounting means to shadow a portion of said substrate mounting means from line-of sight exposure to said target cathode, and an ancillary blocking shield, said ancillary blocking shield positioned in said sputter system to form an extension of said primary blocking shield in the direction of said substrate mounting means, said ancillary blocking shield being displaced inwardly from the periphery of said blocking shield by a predetermined distance and spaced a predetermined distance above said substrate mounting means and serving to shield against the lateral movement of sputtered atoms which are redirected inwardly of the bottom edge of said primary blocking shield by gas scattering collisions.

2. A sputter system in accordance with claim 1 wherein said substrate mounting means comprises means for mounting a generally circular semiconductor wafer, said primary blocking shield comprises a circular shield having a diameter less than the diameter of said semiconductor wafer, and wherein said circular primary blocking shield is positioned above and concentrically with respect to said semiconductor wafer.

3. A sputter system in accordance with claim 2 wherein said ancillary blocking shield comprises a circular ring having a diameter less than the diameter of said primary blocking shield and wherein said ancillary blocking shield is positioned concentrically on the underside of said primary blocking shield.

4. A sputter system in accordance with claim 3 wherein said ancillary blocking shield is positioned inwardly of said bottom edge of said primary blocking shield a predetermined distance y, between 0.1 inch and 0.6 inches.

5. A sputter system in accordance with claim 3 wherein said ancillary blocking shield portion extends downwardly of said primary blocking shield a predetermined distance x-z, between 0.1 inch and 0.5 inches.

6. A sputter system in accordance with claim 3 wherein the predetermined distance, z, from the bottom of said ancillary blocking shield to said substrate is between 0.03 inch to 0.1 inch.

* * * * *